United States Patent
Tung

(10) Patent No.: US 6,372,579 B1
(45) Date of Patent: Apr. 16, 2002

(54) PRODUCING LATERALLY DIFFUSED METAL-OXIDE SEMICONDUCTOR

(75) Inventor: Ming-Tsung Tung, Hsin-Chu Hsian (TW)

(73) Assignee: United Microelectronics Corp., Hsin-Chu (TW)

(*) Notice: Subject to any disclaimer, the term of this patent is extended or adjusted under 35 U.S.C. 154(b) by 0 days.

(21) Appl. No.: 09/262,187

(22) Filed: Mar. 4, 1999

(51) Int. Cl.$^7$ .............................................. H01L 21/336
(52) U.S. Cl. ...................... 438/270; 438/138; 438/981; 438/589
(58) Field of Search ................................ 438/270, 305, 438/429, 268, 981, 138, 589

(56) References Cited

U.S. PATENT DOCUMENTS

| | | | | |
|---|---|---|---|---|
| 4,691,433 A | * | 9/1987 | Pimbley et al. | 438/305 |
| 4,721,987 A | * | 1/1988 | Baglee et al. | 365/149 |
| 5,506,431 A | * | 4/1996 | Thomas | 257/321 |
| 5,723,891 A | * | 3/1998 | Malhi | 257/341 |

* cited by examiner

*Primary Examiner*—Michael Trinh

(57) ABSTRACT

A method for forming a laterally diffused metal-oxide semiconductor is disclosed. The invention normally is for forming a transistor device, which includes the following steps. Firstly a semiconductor layer is provided. Then a field insulating region is formed into the semiconductor layer. Sequentially forming a gate dielectric layer over a portion of the field insulating region is carried out. Then forming a deep portion of a first drain/source region within the semiconductor layer and spaced from the field insulating region/the top surface. Here, the deep portion is doped with dopants of a conductivity type, with the deep portion having a first doping concentration. The next step is forming a lightly doped portion of the first drain/source region within the semiconductor layer and a neighbouring portion of the field insulating region/the oxide top surface and adjacent the channel region. Generally the lightly doped portion is doped with dopants of the conductivity type. And there is a second doping concentration which is less than the first doping concentration. A main portion of said first drain/source region within the semiconductor layer is formed. Therefore the main portion neighbors the field insulating region/the oxide top surface and is adjacent the lightly doped portion. Also, the main portion disposed above the deep portion as well as main portion is doped with dopants of the conductivity type and has a third doping concentration, which is less than the first doping concentration and is greater than the second doping concentration. Then a second drain/source region is formed within the semiconductor layer and spaced from the lightly doped portion of the first drain/source region by a channel region, the second drain/source region is doped with dopants of the conductivity type. Finally the process for forming a gate electrode over at least a portion of the channel region and insulated is carried out therefrom.

16 Claims, 4 Drawing Sheets

PRODUCING LATERALLY DIFFUSED METAL-OXIDE SEMICONDUCTOR

BACKGROUND OF THE INVENTION

1. Field of the Invention

The present invention relates to a process of producing a Laterally Diffused Metal Oxide Semiconductor (LDMOS) transistor, particularly to a method of producing an LDMOS transistor having reduced dimensions, reduced leakage, and a reduced propensity to latch-up.

2. Description of the Prior Art

The Laterally Diffused Metal-Oxide Semiconductor (LDMOS) usually used in the high-voltage integrated circuits may generally be manufactured using some of the same techniques used to fabricate the low voltage circuitry or logic circuitry. Hence, a commonly used high-voltage element for these circuits is the laterally diffused Metal-Oxide transistor (LDMOS). It is firstly mentioned that conventional LDMOS structures are part of the basic understanding.

SUMMARY OF THE INVENTION

The present invention provides a method for forming a laterally diffused metal oxide semiconductor transistor. The method comprises following steps. First, a P substrate is provided. Then, a first N-well and a first P-well are formed and separated from each other in the P substrate, wherein the first N-well and the first P-well are not adjacent to each other. Next, a second N-well and a second P-well are formed and separated from each other in the P substrate, wherein the second N-well overlies the first N-well and the second P-well overlies the first P-well. Thereafter, a field oxide region is formed in the P substrate between the first N-well and the first P-well and the field oxide region overlies on a portion of the second N-well and a portion of the second P-well. Then, a trench is formed in the P substrate by removing a portion of the field oxide region and a portion of the P substrate, wherein the remained field oxide region only overlies on the second N-well. Next, a gate oxide layer is formed on a bottom surface and a sidewall of the trench and on a surface of the second P-well in the P substrate. Thereafter, a polysilicon gate is formed on the P substrate, wherein the trench is filled with the polysilicon gate and the polysilicon gate overlies on a portion of the remained field oxide region and a portion of the second P-well. Next, a N$^+$-type source/drain is formed in the P substrate, wherein the N$^+$-type source/drain is adjacent to the trench and overlies the second P-well, and adjacent to the remained field oxide region and overlies the second N-well. Last, a P$^+$-type drain is formed in the P substrate, wherein the P$^+$-type drain is adjacent to the N$^+$-type source/drain and overlies the second P-well.

The deep portion and the lightly doped portion are formed simultaneously. Also the deep portion and the lightly doped portion are formed simultaneously by implanting dopants of the conductivity type. Then a lightly doped portion of the second drain/source region is formed bordering said channel is carried out.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed. An alternate, asymmetric embodiment will then be described along with the variations in the process flow to fabricate this embodiment.

One of the preferred embodiments of the present invention is shown in FIGS. 1A to 1K. In this embodiment, a P substrate 21 is used to form a LDMOS transistor, which is made in a laterally diffused process with appropriate conductivity type changes to the various regions that are implanted. The processing of the P substrate is described in detail below, while the processing of the P substrate will be readily apparent to those skilled in the art from the detailed description.

FIGS. 1A to 1K are sectional views showing in combination a first embodiment of the process for producing a memory cell having lightly doped source/drain according to the present invention. In order to simplify the description of each of the embodiments, it is assumed that C.M.O.S. (Complementary Metal-Oxide Semiconductor) which serves as switching transistors have already been prepared by a known process, and only the process for producing a stacked capacitor will be described below.

Figure 1A:
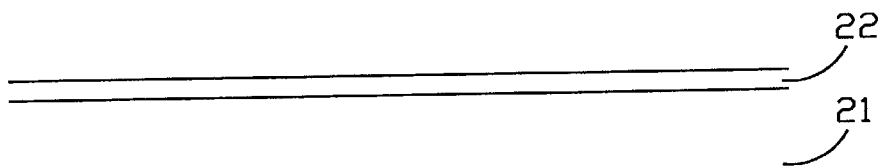
FIGS. 1A to 1K are sectional views showing in combination an embodiment of the present invention.

FIG. 1A shows an embodiment in such a manner that a silicon oxide 22 is provided by a known thermal oxidation method on a semiconductor substrate 21. This depth of the oxide layer is about 1000 angstroms to 3000 angstroms.

Figure 1B:
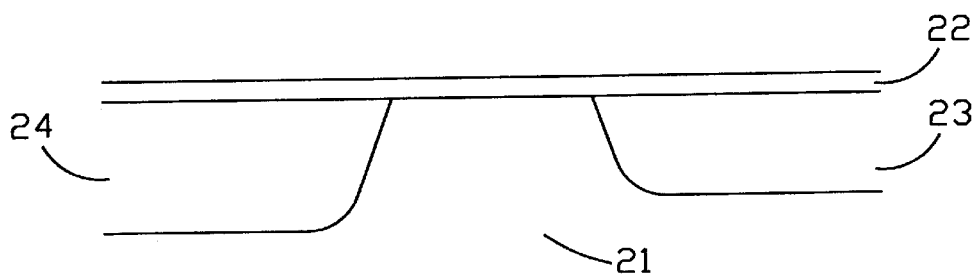

Then FIG. 1B dedicates only a part of the first polysilicon layer named as an active area, N-well 1 mask; P-well 1 mask is defined using a known process technique such as photolithography. Secondly doping N-well 1, 23; P-well 1, 24 by using implant method follows. The final doping parameter is about 3E15 to 2E16 1/cm$^3$. Sequentially N-well 1, 23; P-well 1, 24 is driven in semiconductor layer by thermal diffusion method.

The N-well 1, 23 and the P-well 1, 24 are separated from each other in the P substrate 21 and are not adjacent to each other.

Figure 1C:
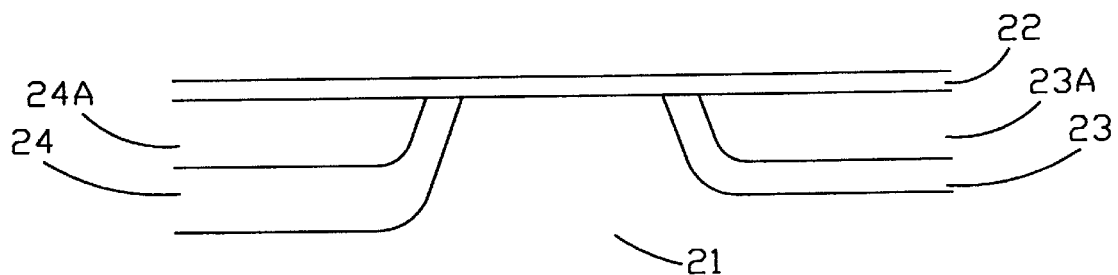

As shown in FIG. 1C, N-well 2, 23A; P-well 2, 24A is then formed as a second conductor layer by N-well mask defining and then implanting by the same technique, implant method. A continous drive-in process is carried out using thermal diffusion method. Its final doping parameter for the implanting process is about 2E16 to 2E17 1/cm$^3$.

The N-well 2, 23A and the P-well 2, 24A are separated from each other in the P substrate 21. The N-well 2, 23A overlies the N-well 1, 23 and the P-well 2, 24A overlies the P-well 1, 24.

Figure 1D:
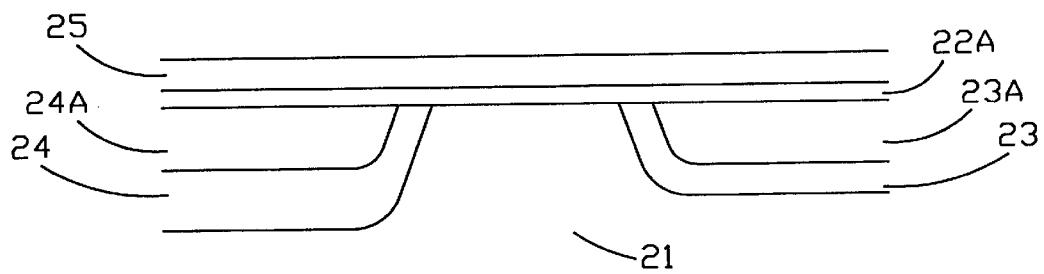

FIG. 1D illustrates that the original silicon oxide layer 22 is removed, and then pad oxide layer 22A on the top surface is formed using thermal oxidation method. Then, nitride deposition 25 is sequentially formed using L.P.C.V.D. (Low Pressure Chemical Vapour Deposition) method as Silicon Nitride 25 and its depth is about 100 angstroms to 300 angstroms. Consequentially the part of pad oxide 22A, depth of the pad oxide layer 22A about 100 angstroms to 200 angstroms, is removed by photolithography method.

Figure 1E:
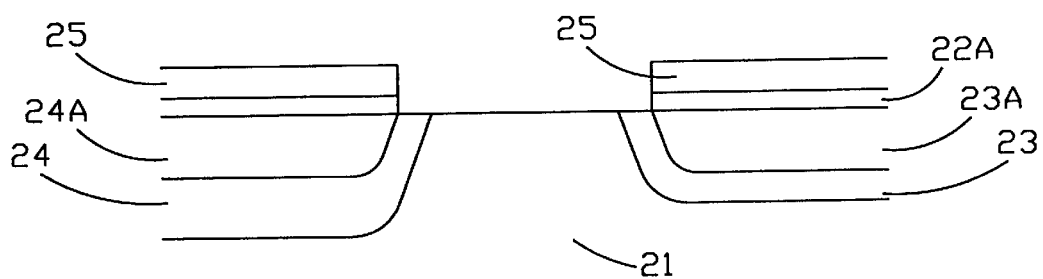
Figure 1F:
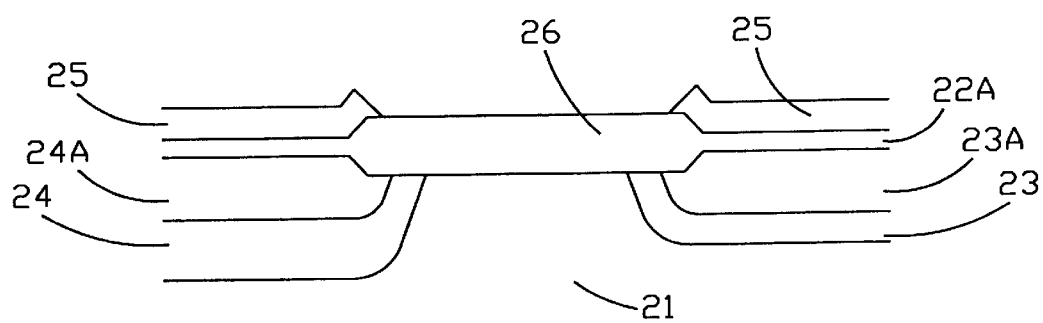

FIG. 1E shows, a portion of pad oxide 22A and a portion of Silicon Nitride 25 is removed to form an opening. The opening exposes the P substrate 21, a portion of the N-well 1, 23, and a portion of the P-well 1, 24. Consequentially a field region 26 is formed in the opening by using L.P.C.V.D. (Low Pressure Chemical Vapour Deposition) method as and its depth is about 3000 angstroms to 10000 angstroms, shown as FIG. 1F.

The field oxide region 26 overlies on a portion of the N-well 2, 23A and a portion of the P-well 2, 24A.

Figure 1G:
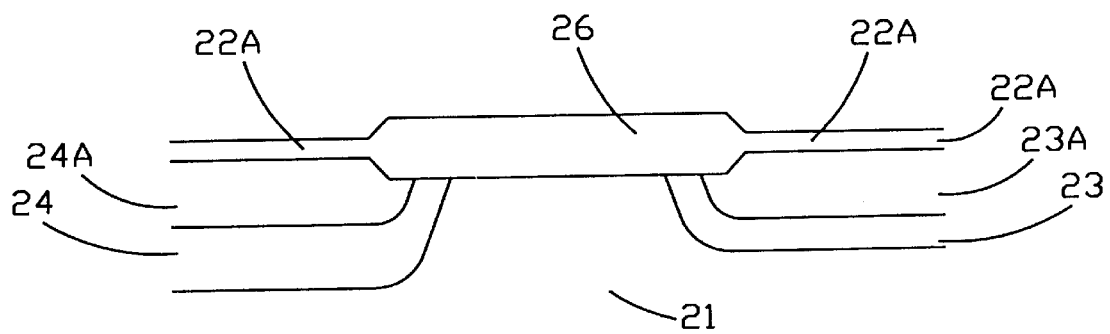
Figure 1H:
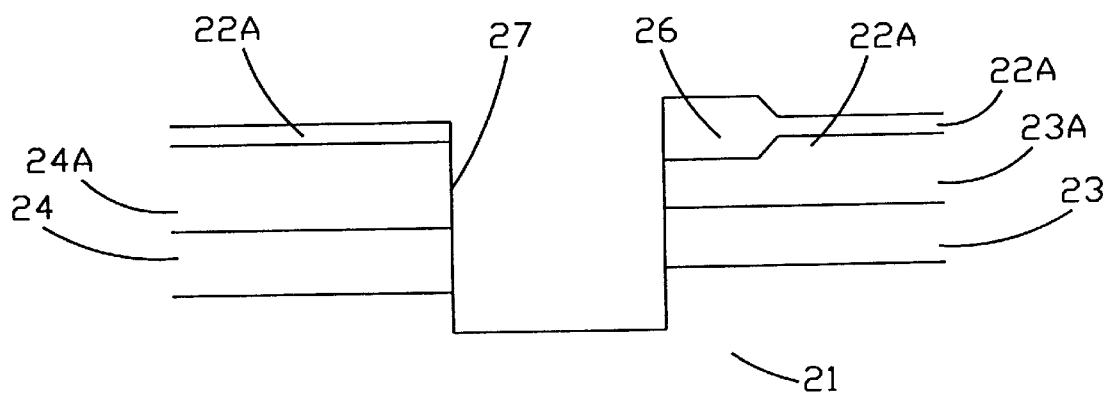

Sequentially, as shown in FIG. 1G, Silicon Nitride 25 is totally removed in the following step. Then as shown in FIG. 1H, in active area, a mask process is carried out and a continuous semiconductor layer is etched. After a trench mask is used for defining, trench 27 longer over than N-well 1, 23 and P-well, 24 will be obtained by a known trench isolation method. Here, the trench isolation method which is employed is a processing method which enables completely non-isotropic etching.

Figure 1I:
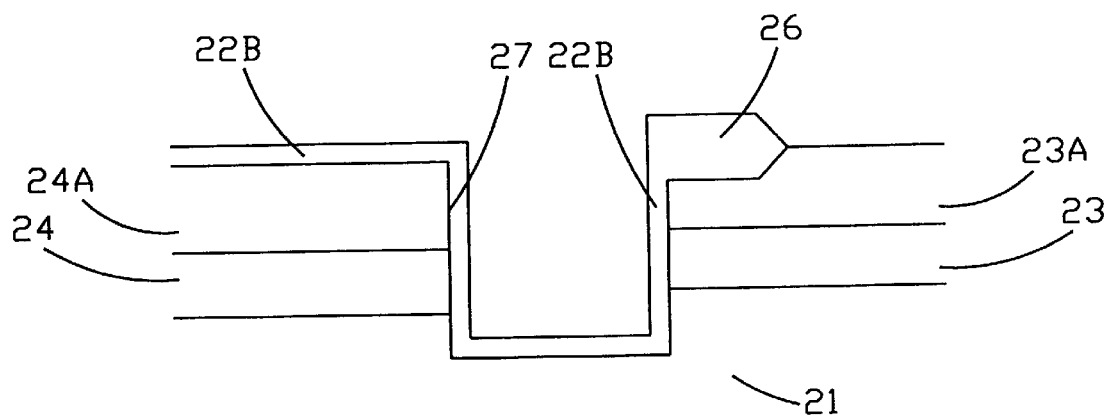
Figure 1J:
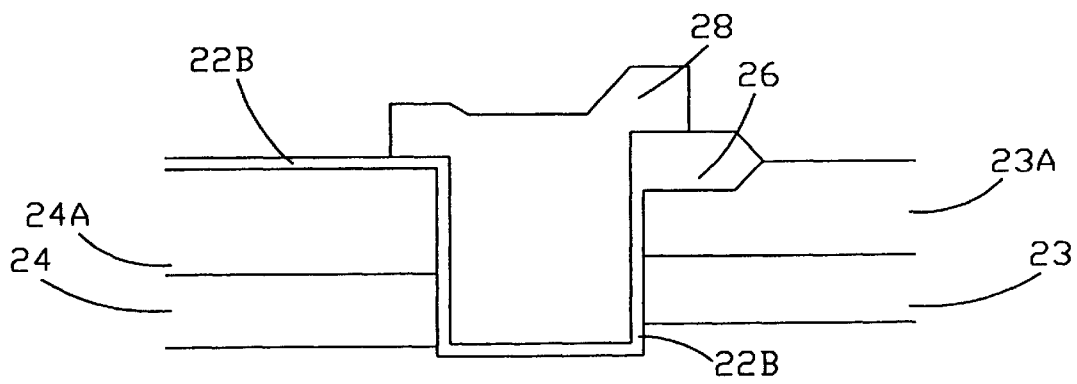
Figure 1K:
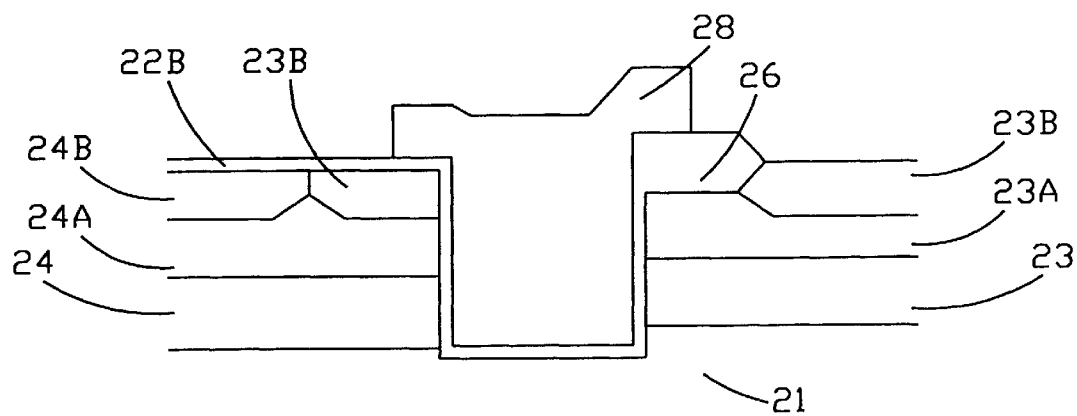

As shown in FIG. 1I, pad oxide 22A is then removed entirely. However, gate oxide 22B is formed quickly instead of this pad oxide 22A. Consequentially in FIG. 1J, $N^+$-type doped polysilicon 28 is deposited and refilled on the above trench by using L.P.C.V.D. method. Then $N^+$-type doped polysilicon 28 is carried out by thermal diffusion or implant method. Finally polysilicon is defined in such a manner, as like silicon oxide layer which defines a first conductor layer is deposited on the substrate by a known CVD (Chemical Vapour Deposition) method. Therefore, finally again, $N^+$-type source/drain and $P^+$-type drain of the transistor will be formed entirely using a conventional annealing method, as FIG. 1K.

While the invention has been described by way of examples and in terms of one preferred embodiment, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

Although specific embodiments have been illustrated and described, it will be obvious to those skilled in the art that various modifications may be made without departing from what is intended to be limited solely by the appended claims.

What is claimed is:

1. A method for forming a laterally diffused metal oxide semiconductor transistor, the method comprising:

providing a P substrate;

forming a first N-well and a first P-well which are separated from each other in said P substrate, wherein said first N-well and said first P-well are not adjacent to each other;

forming a second N-well and a second P-well which are separated from each other in said P substrate, wherein said second N-well overlies said first N-well and said second P-well overlies said first P-well;

forming a field oxide region in said P substrate, wherein said field oxide region is formed between said first N-well and said first P-well, and said field oxide region overlies on a portion of said second N-well and a portion of said second P-well;

removing a portion of said field oxide region and a portion of said P substrate to form a trench in said P substrate, wherein said remained field oxide region only overlies on said second N-well;

forming a gate oxide layer on a bottom surface and a sidewall of said trench and on a surface of said second P-well in said P substrate;

forming a polysilicon gate on said P substrate, wherein said trench is filled with said polysilicon gate and said polysilicon gate overlies on a portion of said remained field oxide region and a portion of said second P-well;

forming a $N^+$-type source/drain in said P substrate, wherein said $N^+$-type source/drain is adjacent to said trench and overlies said second P-well, and adjacent to said remained field oxide region and overlies said second N-well; and forming a $P^+$-type drain in said P substrate, wherein said $P^+$-type drain is adjacent to said $N^+$-type source/drain and overlies said second P-well.

2. The method according to claim 1, further comprising a step of forming an oxide layer on said P substrate before forming said first N-well and said first P-well.

3. The method according to claim 2, wherein a thickness of said oxide layer is about between 1000 to 3000 angstroms.

4. The method according to claim 1, wherein said field oxide region is formed by following steps:

forming a pad oxide layer on a surface of said P substrate;

forming a nitride layer on said pad oxide layer;

removing a portion of said nitride layer and said pad oxide layer to form an opening to expose said P substrate, a portion of said first N-well and a portion of said first P-well;

forming said field oxide region in said P substrate of said opening; and removing said nitride layer.

5. The method according to claim 4, wherein a thickness of said pad oxide layer is about between 100 to 200 angstroms.

6. The method according to claim 4, wherein a thickness of said nitride layer is about between 100 to 300 angstroms.

7. The method according to claim 4, wherein said field oxide region is formed by a low-pressure chemical vapor deposition method.

8. The method according to claim 1, wherein a depth of said trench is longer over than said first N-well and said first P-well in said P substrate.

9. The method according to claim 4, further comprising a step of removing said pad oxide layer after forming said trench.

10. A method for forming a laterally diffused metal oxide semiconductor transistor, the method comprising:

providing a P substrate;

forming a first N-well and a first P-well which are separated from each other in said P substrate, wherein said first N-well and said first P-well are not adjacent to each other;

forming a second N-well and a second P-well which are separated from each other in P substrate, wherein said second N-well is overlies said first N-well and said second P-well overlies said first P-well;

forming a pad oxide layer on a surface of said P substrate;

forming a nitride layer on said pad oxide layer;

removing a portion of said nitride layer and said pad oxide layer to form an opening to expose said P substrate, a portion of said first N-well and a portion of said first P-well;

forming said field oxide region in said opening of said P substrate, wherein said field oxide region overlies on a portion of said second N-well and a portion of said second P-well;

removing said nitride layer;

etching a portion of said field oxide region and a portion of said P substrate to form a trench in said P substrate, wherein said remained field oxide region only overlies on said second N-well;

removing said pad oxide layer;

forming a gate oxide layer on a bottom surface and a sidewall of said trench and on a surface of said second P-well in said P substrate;

forming a polysilicon gate on said P substrate, wherein said trench is filled with said polysilicon gate and said polysilicon gate overlies on a portion of said remained field oxide region and a portion of said second P-well;

forming a $N^+$-type source/drain in said P substrate, wherein said $N^+$-type source/drain is adjacent to said trench and overlies said second P-well, and adjacent to said remained field oxide region and overlies said second N-well; and forming a $P^+$-type drain in said P substrate, wherein said $P^+$-type drain is adjacent to said $N^+$-type source/drain and overlies said second P-well.

11. The method according to claim 10, further comprising a step of forming an oxide layer on said P substrate before forming said first N-well and said first P-well.

12. The method according to claim 11, wherein a thickness of said oxide layer is about between 1000 to 3000 angstroms.

13. The method according to claim 10, wherein a thickness of said pad oxide layer is about between 100 to 200 angstroms.

14. The method according to claim 10, wherein a thickness of said nitride layer is about between 100 to 300 angstroms.

15. The method according to claim 10, wherein said field oxide region is formed by a low-pressure chemical vapor deposition method.

16. The method according to claim 10, wherein a depth of said trench is longer over than said first N-well and said first P-well in said P substrate.

* * * * *